(12) United States Patent
Takayama

(10) Patent No.: US 8,110,755 B2
(45) Date of Patent: Feb. 7, 2012

(54) PACKAGE FOR AN OPTICAL DEVICE

(75) Inventor: Yoshiki Takayama, Shiga (JP)

(73) Assignee: Panasonic Corporation, Osaka (JP)

( * ) Notice: Subject to any disclaimer, the term of this patent is extended or adjusted under 35 U.S.C. 154(b) by 366 days.

(21) Appl. No.: 12/559,887

(22) Filed: Sep. 15, 2009

(65) Prior Publication Data

US 2010/0193240 A1    Aug. 5, 2010

(30) Foreign Application Priority Data

Feb. 4, 2009  (JP) ................................. 2009-023791
Jul. 15, 2009  (JP) ................................. 2009-166664

(51) Int. Cl.
*H01L 23/28* (2006.01)

(52) U.S. Cl. .................... 174/521; 257/680; 257/688

(58) Field of Classification Search ............ 174/521; 257/680, 788
See application file for complete search history.

(56) References Cited

U.S. PATENT DOCUMENTS

| | | | | |
|---|---|---|---|---|
| 5,355,016 A * | 10/1994 | Swirbel et al. | ............... | 257/659 |
| 5,998,860 A * | 12/1999 | Chan et al. | ................... | 257/679 |
| 6,476,469 B2 * | 11/2002 | Hung et al. | ................... | 257/676 |
| 6,624,921 B1 * | 9/2003 | Glenn et al. | ................... | 359/291 |
| 6,649,991 B1 * | 11/2003 | Chen et al. | ................... | 257/433 |
| 6,686,667 B2 * | 2/2004 | Chen et al. | ................... | 257/787 |
| 7,005,720 B2 * | 2/2006 | Huang et al. | ................... | 257/433 |
| 7,078,791 B1 * | 7/2006 | Tindle et al. | ................... | 257/680 |
| 7,274,094 B2 * | 9/2007 | Boon et al. | ................... | 257/680 |
| 7,936,062 B2 * | 5/2011 | Humpston et al. | ........... | 257/704 |
| 2006/0273437 A1 * | 12/2006 | Beer et al. | ...................... | 257/680 |
| 2007/0126914 A1 | 6/2007 | Komatsu et al. | | |
| 2008/0128848 A1 | 6/2008 | Suzuki et al. | | |
| 2008/0224249 A1 | 9/2008 | Nabe et al. | | |
| 2008/0283951 A1 | 11/2008 | Nabe et al. | | |
| 2010/0164081 A1 * | 7/2010 | Haskett et al. | ................ | 257/680 |
| 2010/0164082 A1 * | 7/2010 | Fujisawa | ......................... | 257/680 |

FOREIGN PATENT DOCUMENTS

| | | | |
|---|---|---|---|
| JP | 61-123288 | | 6/1986 |
| JP | 61-123288 | * | 6/1996 |

* cited by examiner

*Primary Examiner* — Hung Ngo
(74) *Attorney, Agent, or Firm* — McDermott Will & Emery LLP

(57) ABSTRACT

A device includes: a package having a bottom and a side wall surrounding the bottom; an element adhered to the bottom of the package; an internal contact formed inside the package; a resin encapsulation material with which a space between the package and the element is filled; and a coating formed to cover an end surface of the internal contact near the element, and made of a material whose thermal expansion coefficient is greater than or equal to the thermal expansion coefficient of the package and less than the thermal expansion coefficient of the resin encapsulation material.

9 Claims, 5 Drawing Sheets

PACKAGE FOR AN OPTICAL DEVICE

CROSS-REFERENCE TO RELATED APPLICATIONS

This application claims priority to Japanese Patent Application No. 2009-023791 filed on Feb. 4, 2009 and Japanese Patent Application No. 2009-166664 filed on Jul. 15, 2009, the disclosure of each of which including the specification, the drawings, and the claims is hereby incorporated by reference in its entirety.

BACKGROUND

The present disclosure relates to devices, and more particularly relates to a device configured such that the surrounding area of an element contained in a concave package is filled with a resin encapsulation material.

In recent years, downsizing of electronic equipment has been increasingly accelerated. Further downsizing of devices for use in electronic equipment, e.g., optical devices, is also reasonably required. A known optical device has been configured such that an optical element is contained in a concave package (enclosure) whose opening is sealed by a cover glass or the like (hereinafter referred to as a transparent member). On the other hand, in order to meet the above-identified requirement, optical devices have been developed wherein a transparent member is adhered directly onto an optical element. Such optical devices have been further downsized, and have become increasingly thinner.

However, the configuration in which a transparent member is adhered directly onto an optical element shortens the distances between the end surfaces (lateral end surfaces) of the transparent member and an optical receiver portion of the optical element. Therefore, undesired incident light becomes more likely to enter the optical receiver portion through the end surfaces of the transparent member. Therefore, image defects, such as flare or ghost images, are caused due to the influence of the undesired incident light.

To address the problem, the configuration in which a light blocking layer is formed on an end surface of the transparent member, or the configuration in which the area of the transparent member is larger than that of the optical receiver portion of the optical element has been proposed in order to prevent incident light from entering the optical receiver portion from outside the end surface of the transparent member.

Furthermore, for example, in Japanese Unexamined Patent Application Publication No. 61-123288, an optical device having the configuration described below has been proposed. More particularly, an optical element configured such that a transparent member is adhered directly onto an optical receiver portion of the optical element is contained in a package having a concave cross section. The interior of the concave package is provided with steps higher than the inside bottom (die attach portion) thereof. Internal contacts formed on the steps and made of gold plating or any other material are electrically connected through gold wires or other components to a pad formed on the optical element. Moreover, the interior of the concave package is filled with a light-blocking resin material, and the filling light-blocking resin material covers the entire end surfaces of the transparent member. This prevents undesired incident light from entering the optical receiver portion through the end surfaces of the transparent member.

SUMMARY

However, when, as in the optical device described in Japanese Unexamined Patent Application Publication No. 61-123288, an optical element onto which a transparent member is adhered directly is contained in a concave package, and a light-blocking resin material with which the interior of the concave package is filled covers the entire end surfaces of the transparent member, such conditions cause the light-blocking resin material to extend toward the opening of the concave package, i.e., upwardly. The reason for this is that the light-blocking resin material has a greater thermal expansion coefficient than the concave package under high temperature conditions in a reflowing process or any other process or a mounting substrate on which an optical device is to be mounted. The above-described extension of the light-blocking resin material causes a high stress between the concave package and the light-blocking resin material. Consequently, gold platings forming the internal contacts inside the concave package may be separated from the light-blocking resin material. This separation starts from a part of the concave package having low adhesion to the light-blocking resin material, e.g., the end surfaces of the gold platings, in particular, near a chip.

Furthermore, the separation of the gold platings from the light-blocking resin material causes a wire providing connection between the optical element and the internal contacts to be pulled by the light-blocking resin material. Therefore, the wire may be broken, leading to electrical failures.

In view of the problems mentioned above, an object of the present disclosure is to provide a device which is configured such that the surrounding area of an element contained in a package is filled with a resin encapsulation material, and which can prevent the package from being separated from the resin encapsulation material due to thermal stress.

In order to achieve the above-described object, an example device is configured such that the end surface of an internal contact near a semiconductor element is covered with a coating.

Specifically, the example device includes: a package having a bottom and a side wall surrounding the bottom; an element adhered to the bottom of the package; an internal contact formed inside the package; a resin encapsulation material with which a space between the package and the element is filled; and a coating formed to cover an end surface of the internal contact near the element, and made of a material whose thermal expansion coefficient is greater than or equal to the thermal expansion coefficient of the package and less than the thermal expansion coefficient of the resin encapsulation material.

According to the example device, under high temperature conditions, e.g., in a reflowing process for mounting the device on a mounting substrate, also when the resin encapsulation material has a greater thermal expansion coefficient than the package, and consequently the stress of the resin encapsulation material is increased at the interface between the resin encapsulation material and the package, the starting point of the separation between the resin encapsulation material and the internal contact is eliminated. Therefore, the internal contact becomes less likely to be separated from the resin encapsulation material, resulting in the increased reliability of the device.

A region necessary for provision of the coating can fall within a region of an end part of the internal contact near the element (chip) which has conventionally formed an unstable shape and exhibited unstable plate adhesion and to which a wire has been considered to be unable to be bonded. Therefore, the size of the internal contact does not need to be increased to provide the coating.

In the example device, the element may be an optical element having an optical receiver portion, and the example device may further include a transparent member formed to cover the optical receiver portion and adhered to the optical element.

Thus, an optical device can be achieved wherein undesired incident light does not cause image defects, such as flare or ghost images.

In the example device, the resin encapsulation material may provide light blocking.

In the example device, a part of the coating may be located above the end surface of the internal contact near the element.

In view of the above, the top of the coating only needs to be flush with or higher than the top surface of the internal contact, and a part of the coating may lie on an outer part of the top surface of the internal contact. This can more certainly cover the end surface of the internal contact. Therefore, the internal contact becomes less likely to be separated from the resin encapsulation material.

In this case, another part of the coating may be located below the end surface of the internal contact near the element.

In the example device, the coating may be made of the same material as the package.

In this case, the coating may be formed before the package is formed with the internal contact. Alternatively, after the formation of the internal contact, the coating may be formed by a printing process, an application process, a coating process, or any other process. The coating does not always need to be made of the same material as the package. In other words, the coating may be made of a material whose thermal expansion coefficient is greater than or equal to that of the package and less than that of the resin encapsulation material. Thus, the coating can reduce the interface stress which is induced due to the difference between the thermal expansion coefficient of the package and that of the resin encapsulation material. This stress reduction can restrain the separation between the package and the resin encapsulation material.

In the example device, the package may be formed by stacking a plurality of insulative substrates.

In the example device, the package may include a plurality of insulative substrates and a resin material.

In the example device, the package may be formed by molding.

As described above, the example device configured such that the surrounding area of the element contained in the concave package is filled with the resin encapsulation material can prevent the separation between the package and the resin encapsulation material due to thermal stress, thereby providing high reliability.

BRIEF DESCRIPTION OF THE DRAWINGS

FIGS. 1A and 1B illustrate a device according to an example embodiment, wherein FIG. 1A is a plan view of the device, and FIG. 1B is a cross-sectional view taken along the line Ib-Ib in FIG. 1A.

DETAILED DESCRIPTION

Example Embodiment

An example embodiment will be described with reference to the drawings.

Figure 1A:
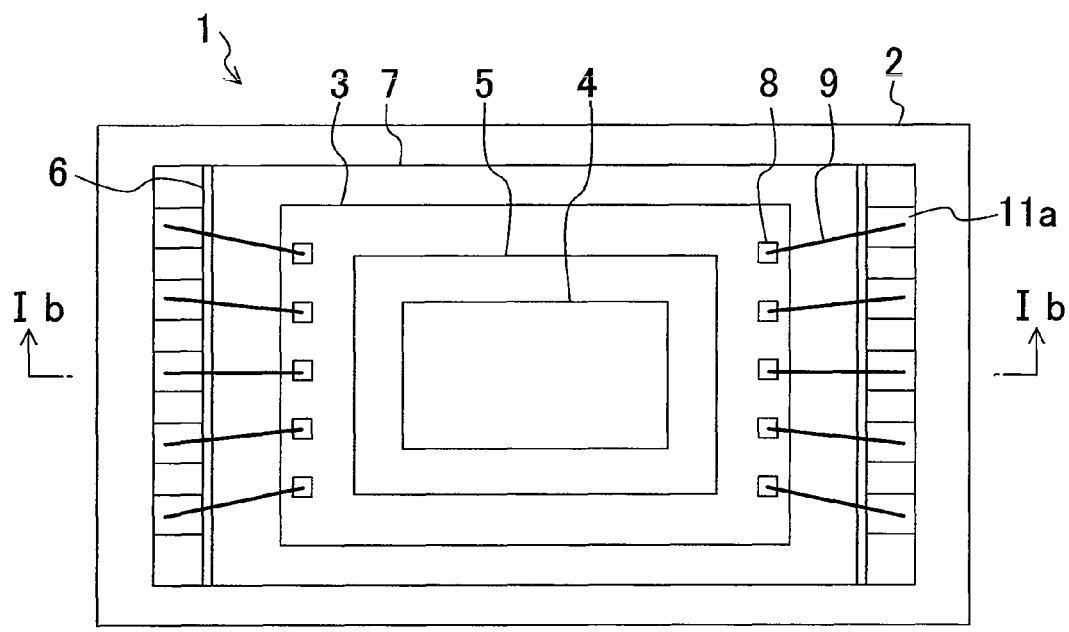
Figure 1B:
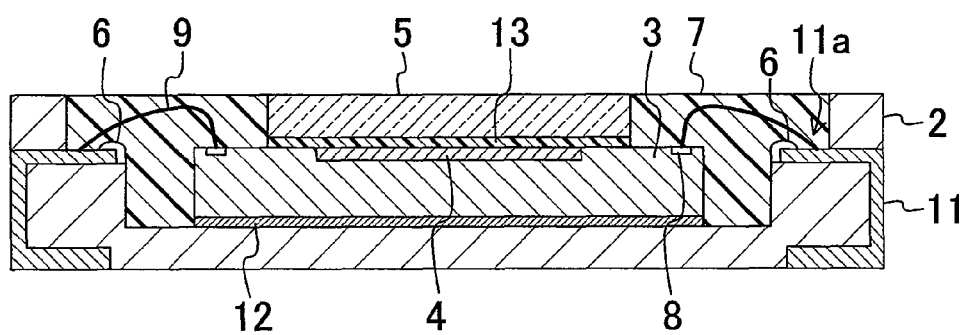

FIGS. 1A and 1B illustrate a device according to an example embodiment, wherein FIG. 1A is a plan view of the device, and FIG. 1B is a cross-sectional view taken along the line Ib-Ib in FIG. 1A.

As illustrated in FIGS. 1A and 1B, a device 1 according to this example embodiment includes an optical element 3 adhered onto the inside bottom of a concave casing (package) 2, i.e., a casing 2 having a bottom surrounded by side walls. An optical receiver portion 4 of the optical element 3 is selectively formed in the upper part thereof. A transparent member 5 is adhered onto the top surface of the optical element 3 by a resin adhesive 13 to cover the optical receiver portion 4. Electrode portions 8 of the optical element 3 being electrically continuous with the optical receiver portion 4 are formed in an outer part of the top surface of the optical element 3 that is not covered with the transparent member 5.

The optical element 3 onto the top surface of which the transparent member 5 is adhered in the above-mentioned manner is packaged using an optical element holder composed of the casing 2 and leads 11 extending from inside the casing 2 toward outside the casing 2. Here, parts of the leads 11 exposed at the inside of the casing 2 form internal contacts 11a.

More specifically, the bottom surface of the optical element 3 is adhered onto the inside bottom of the casing 2 by a die bonding (DB) material 12. The electrode portions 8 are electrically connected through wires 9 to the internal contacts 11a. The surrounding area of the transparent member 5 and optical element 3 in the casing 2 is filled with a resin encapsulation material 7 also serving as light-blocking material. An acrylic resin, an epoxy resin, a silicone resin, or any other resin can be used as the resin encapsulation material 7 covering the lateral end (side) surfaces of the transparent member 5.

Furthermore, a transparent resin material, such as an acrylic resin, an epoxy resin, or a silicone resin, can be used as the resin adhesive 13.

Glass, an infrared (IR) cut filter, an optical low pass filter, or any other material can be used as a material of the transparent member 5 adhered onto the top surface of the optical element 3. In general, glass is used as a material of the transparent member 5, and forms a flat sheet having a substantially square plan-shape. The upper and lower surfaces of the transparent member 5 are both sized to cover the optical receiver 4.

The optical element 3 is not limited, and may be, for example, an image sensor or any other element. For example, an epoxy resin can be used as the DB material 12.

One of the features of this example embodiment is that the end surfaces of the internal contacts 11a near the optical element 3 are covered with coatings 6 made of the same material as the casing 2, or a material whose thermal expansion coefficient is greater than or equal to that of the casing 2 and less than that of the resin encapsulation material 7. In this example embodiment, the coatings 6 are located over end parts of the internal contacts 11a near the optical element 3.

When the end surfaces of the internal contacts 11a near the optical element 3 are covered with the coatings 6 in the above-mentioned manner, this provides the advantages described below. More particularly, under high temperature conditions in a reflowing process or any other process for mounting the device 1 on a mounting substrate, also when the resin encapsulation material 7 has a greater thermal expansion coefficient than the casing 2, and consequently the stress at the interface between the resin encapsulation material 7 and the casing 2 is increased, provision of the coatings 6 eliminates the starting points of the separation between the resin encapsulation material 7 and gold platings forming the internal contacts 11a. Therefore, the internal contacts 11a become less likely to be separated from the resin encapsulation material 7, resulting in the increased reflow anneal temperature and the increased reliability of the device.

When not the same material as the casing 2, but a material whose thermal expansion coefficient is greater than or equal to that of the casing 2 and less than that of the resin encapsulation material 7 is used as a material of the coatings 6, the coatings 6 can reduce the interface stress which is induced due to the difference between the thermal expansion coefficient of the casing 2 and that of the resin encapsulation material 7. This stress reduction can further restrain the separation between the casing 2 and the resin encapsulation material 7.

Modification 1 of Example Embodiment

Figure 2A:
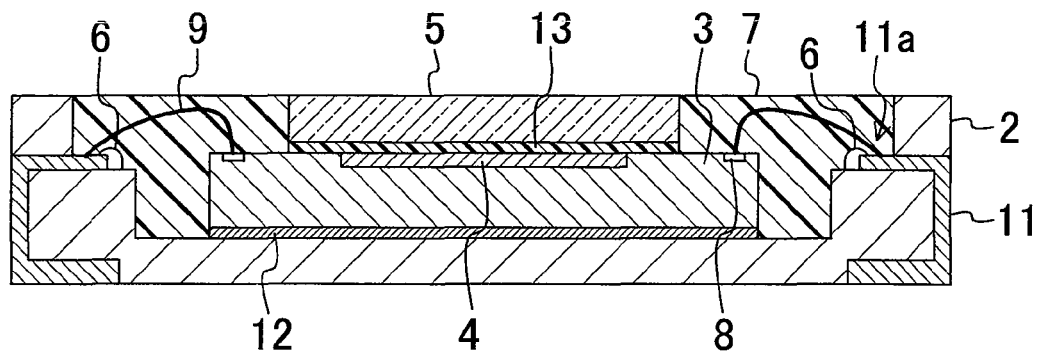
FIG. 2A is a cross-sectional view of a device according to a first modification of the example embodiment.

As in the device of a first modification illustrated in FIG. 2A, internal contacts 11a may be formed such that their lateral ends near the optical element 3 are located closer to the middles of associated steps of the casing 2 than the lateral ends of the associated steps near the optical element 3. This not only provides the same advantages as the device 1 illustrated in FIGS. 1A and 1B, but also facilitates forming coatings 6 on the steps of the casing 2.

Modification 2 of Example Embodiment

Figure 2B:
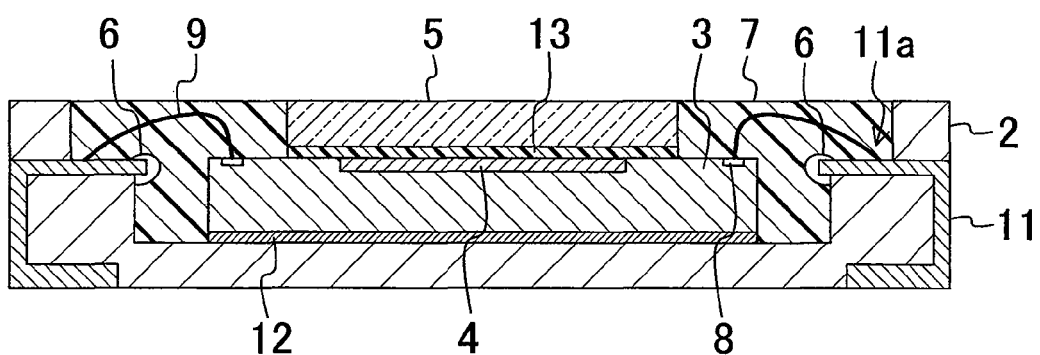
FIG. 2B is a cross-sectional view of a device according to a second modification of the example embodiment.

As in the device of a second modification illustrated in FIG. 2B, the lateral ends of the internal contacts 11a near the optical element 3 may project beyond the lateral ends of the steps near the optical element 3 like eaves. This not only provides the same advantages as the device 1 illustrated in FIGS. 1A and 1B, but also can increase the margin of the bonding area of each internal contact 11a for the associated wire 9.

Modification 3 of Example Embodiment

Figure 2C:
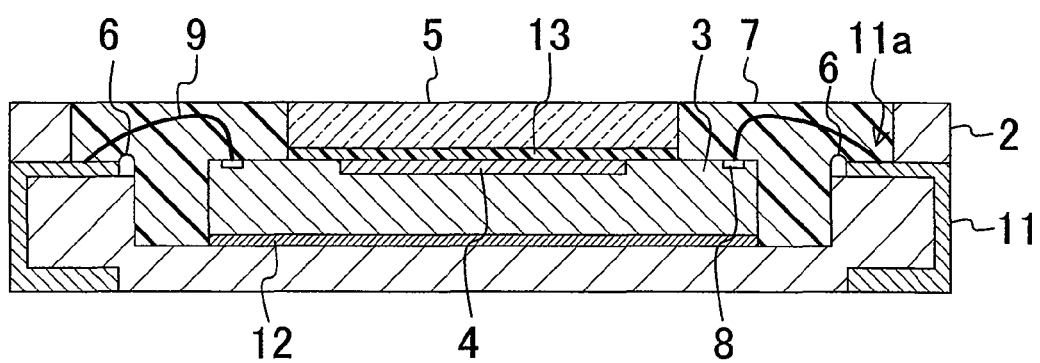
FIG. 2C is a cross-sectional view of a device according to a third modification of the example embodiment.

As in the device of a third modification illustrated in FIG. 2C, the coatings 6 covering the end surfaces of the internal contacts 11a near the optical element 3 may cover only the above-described end surfaces, i.e., only the side surfaces of the internal contacts 11a near the optical element 3. This can also provide the same advantages as the device 1 illustrated in FIGS. 1A and 1B.

Modification 4 of Example Embodiment

Figure 3A:
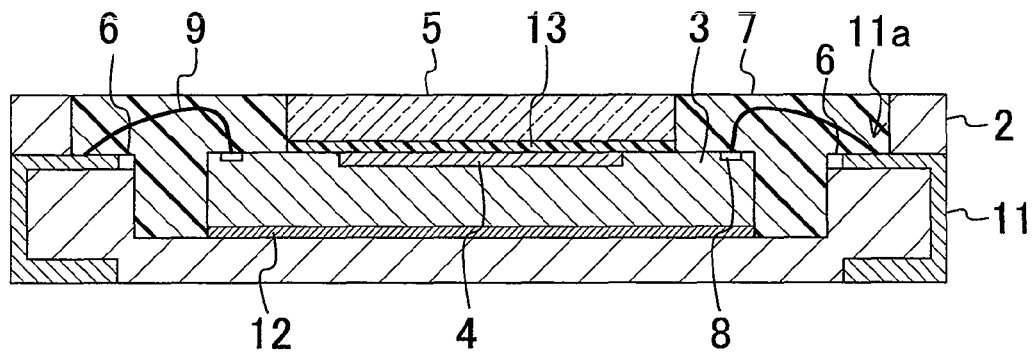
FIG. 3A is a cross-sectional view of a device according to a fourth modification of the example embodiment.

As in the device of a fourth modification illustrated in FIG. 3A, each coating 6 only needs to cover only the end surface of the associated internal contact 11a near the optical element 3, and the top of the coating 6 only needs to be flush with or higher than the top surface of the associated internal contact 11a. This can also provide the same advantages as the device 1 illustrated in FIGS. 1A and 1B.

Modification 5 of Example Embodiment

Figure 3B:
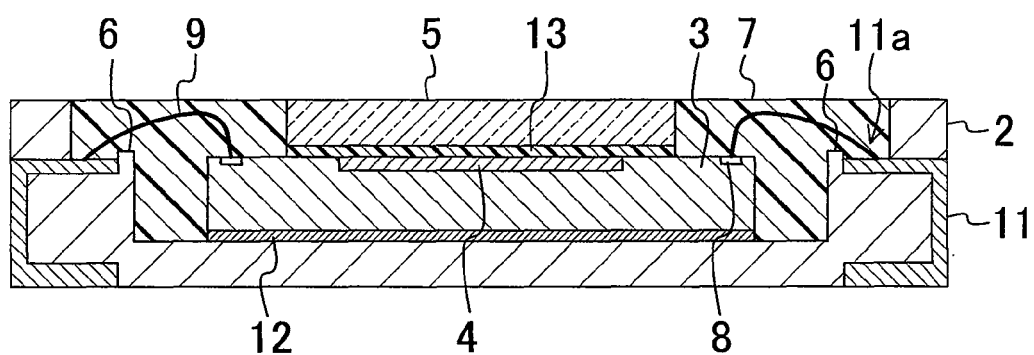
FIG. 3B is a cross-sectional view of a device according to a fifth modification of the example embodiment.

As in the device of a fifth modification illustrated in FIG. 3B, the coatings 6 may be formed integrally with the casing 2. Furthermore, the coatings 6 may be formed before the casing 2 is formed with the internal contacts 11a. Alternatively, after the casing 2 is formed with the internal contacts 11a, the coatings 6 may be formed to cover the internal contacts 11a.

Modification 6 of Example Embodiment

Figure 3C:
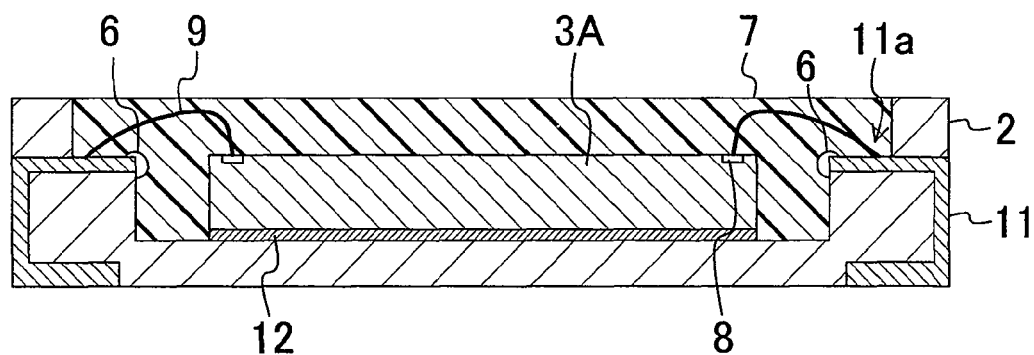
FIG. 3C is a cross-sectional view of a device according to a sixth modification of the example embodiment.

For the device of a sixth modification illustrated in FIG. 3C, instead of the optical element 3, a semiconductor element 3A is encapsulated in the casing 2. Here, for example, a large-scale integrated (LSI) circuit, such as a microprocessor, can be used as the semiconductor element 3A. Even with the semiconductor element 3A encapsulated in the casing 2, the internal contacts 11a become less likely to be separated from the resin encapsulation material 7, resulting in the increased reflow anneal temperature and the increased reliability of the device.

Furthermore, in FIG. 3C, the lateral ends of the internal contacts 11a near the optical element 3 coincide with the lateral ends of the associated steps near the optical element 3.

The locations of the lateral ends of the internal contacts 11a located near the optical element 3 and on the steps and the shapes of the coatings 6 do not always need to be identical between the opposed steps (the left and right steps in each of the drawings). In other words, the shapes of the coatings 6 in the example embodiment and the first through sixth modification can be combined as appropriate.

A method for fabricating a device 1 configured as described above will be described hereinafter.

First, an optical element 3 is prepared. The optical element 3 includes an optical receiver portion 4 formed in an upper middle part of a chip, and electrode portions 8 which are formed in a part of the chip surrounding the optical receiver portion 4 and are electrically continuous with the optical receiver portion 4. Subsequently, a resin adhesive 13 made of, for example, an acrylic resin, an epoxy resin, or a silicone resin is applied onto the optical element 3 to cover the optical receiver portion 4. Then, a transparent member 5 is adhered onto the applied resin adhesive 13 to cover the optical receiver portion 4.

Next, a concave casing 2 serving as a semiconductor package and made of, for example, an epoxy resin or alumina ceramic is prepared. The casing 2 includes leads 11 having internal contacts 11a and external contacts. Subsequently, the optical element 3 is adhered onto the inside bottom of the casing 2 by a thermosetting die bonding material 12 made of, for example, an epoxy resin.

Next, the internal contacts 11a of the leads 11 are electrically connected through wires 9 made of, for example, aluminum (Al) or gold (Au) to the electrode portions 8 of the optical element 3. Subsequently, the surrounding area of the transparent member 5 and optical element 3 in the casing 2 is filled with a resin encapsulation material 7, for example, by lithography application or printing application. A resin encapsulation material using, for example, an acrylic resin, an epoxy resin, or a silicone resin as the main component can be used as the resin encapsulation material 7.

As described above, the method for fabricating a device according to the example embodiment is mostly achieved by the known process steps.

The device 1 according to this example embodiment is not limited to the above-mentioned fabrication method.

Furthermore, methods for fabricating a coating 6 that is a distinctive part of the device 1 according to this example embodiment will be described hereinafter.

(First Fabrication Method)

A first fabrication method for a coating 6 will be described with reference to FIGS. 4A through 4C.

Figure 4A:
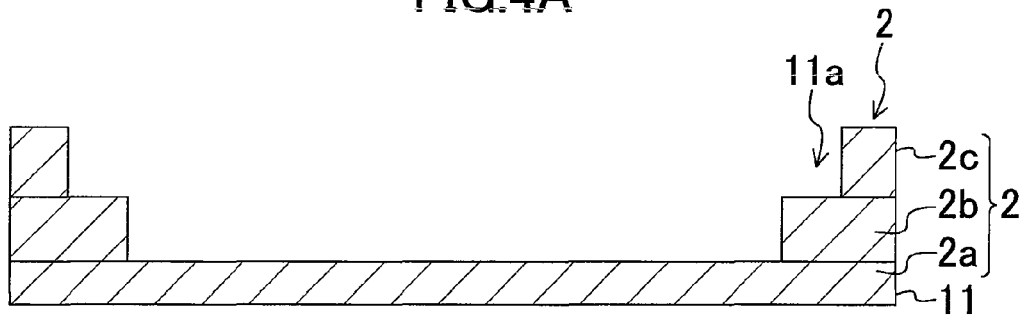
FIGS. 4A through 4C are cross-sectional views illustrating the principal part of the device according to the example embodiment in process steps of a first fabrication method for the principal part in a sequential order.

First, as illustrated in FIG. 4A, a casing 2 is prepared. The casing 2 is made of, for example, ceramic or any other material, and is obtained by stacking a first insulative substrate 2a, a second insulative substrate 2b, and a third insulative substrate 2c. Here, the casing 2 is formed in the manner in which the frame-like second insulative substrate 2b and the frame-like third insulative substrate 2c together forming a side wall of the casing 2 are stacked sequentially on an outer part of the sheet-like first insulative substrate 2a. Although not illustrated, the first insulative substrate 2a is formed with necessary interconnects.

Figure 4B:
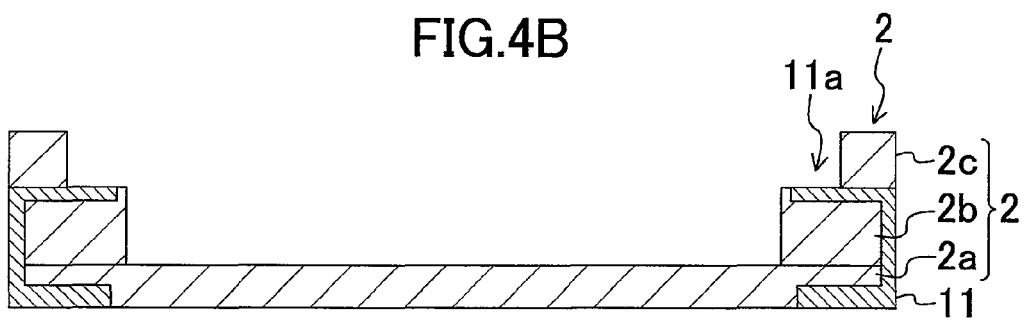

Next, as illustrated in FIG. 4B, leads 11 are formed, by a printing process or a plating process, to extend from the lower and side surfaces of the first insulative substrate 2a toward the side and upper surfaces of the second insulative substrate 2b. As mentioned above, parts of the leads 11 exposed at the inside of the casing 2 form internal contacts 11a.

Figure 4C:
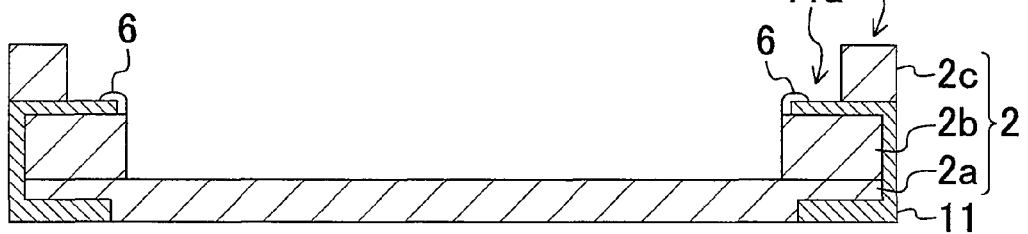

Next, as illustrated in FIG. 4C, coatings 6 are formed by an application process using an application nozzle, a filling process, a printing process, a coating process, or any other process in the following manner: the same paste material as the casing 2, or a paste material whose thermal expansion coefficient is greater than or equal to that of the material of the casing 2 and less than that of the resin encapsulation material 7 is provided onto the internal contacts 11a to cover the lateral end surfaces of the internal contacts 11a. Subsequently, the surfaces of the internal contacts 11a are plated, e.g., gold-plated. This plating process may be conducted either before or after the formation of the coatings 6. If a plating process is conducted before the formation of the coatings 6, the coatings 6 only need to be formed prior to the charge of the resin encapsulation material 7. The order of the process steps in the fabrication method for the coatings 6 is not limited.

(Second Fabrication Method)

Next, a second fabrication method for a coating 6 will be described with reference to FIGS. 5A through 5C.

Figure 5A:
FIGS. 5A through 5C are cross-sectional views illustrating the principal part of the device according to the example embodiment in process steps of a second fabrication method for the principal part in a sequential order.

First, as illustrated in FIG. 5A, a structure made of, for example, ceramic is prepared. The structure is obtained by stacking a frame-like second insulative substrate 2b forming a side wall of the casing 2 on an outer part of a sheet-like first insulative substrate 2a formed with necessary interconnects.

Figure 5B:
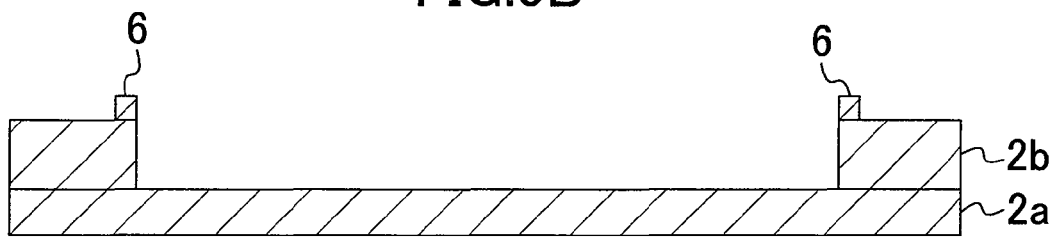

Next, as illustrated in FIG. 5B, coatings 6 made of the same material as the first insulative substrate 2a and the second insulative substrate 2b are formed on an inner end part of the frame-like second insulative substrate 2b by an application process using an application nozzle or any other process to come into contact with the lateral end surfaces of internal contacts that will be formed in a later process step.

Figure 5C:
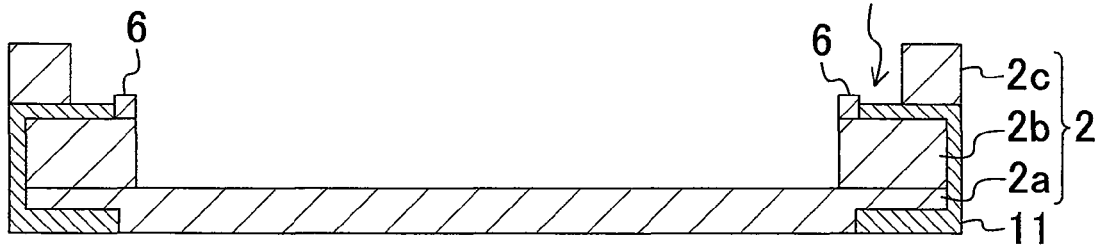

Next, as illustrated in FIG. 5C, leads 11 are formed, by a printing process or a plating process, to extend from the lower and side surfaces of the first insulative substrate 2a toward the side and upper surfaces of the second insulative substrate 2b. Here, end parts of the leads 11 located on the second insulative substrate 2b form internal contacts 11a. The inner lateral end surfaces of the internal contacts 11a are in contact with the outer side surfaces of the coatings 6. Thereafter, a third insulative substrate 2c made of ceramic or any other material is stacked on parts of the leads 11 located on the second insulative substrate 2b.

Also in the second fabrication method, a material of the coatings 6 is not limited to the same material as the insulative substrates forming the casing 2. A material whose thermal expansion coefficient is greater than or equal to that of the material of the casing 2 and less than that of the resin encapsulation material 7 can be used as a material of the coatings 6.

Furthermore, in the first and second fabrication methods, the structure of the casing 2 is obtained by stacking a plurality of insulative substrates made of ceramic or any other material. However, this is not restrictive. The casing 2 may be formed, for example, by molding. Alternatively, the casing 2 may be formed by combining insulative substrates and a molded material together. Also in this case, the coatings 6 covering the internal contacts 11a are formed by the first or second fabrication methods.

As described above, the device according to the example embodiment can ensure high quality and high reliability even with a downsized package, and is useful for, e.g., a device configured such that the surrounding area of an element contained, in particular, in a concave package is filled with a resin encapsulation material.

What is claimed is:

1. A device comprising:
a package having a bottom and a side wall surrounding the bottom;
an element adhered to the bottom of the package;
an internal contact formed inside the package;
a resin encapsulation material with which a space between the package and the element is filled; and
a coating formed to cover an end surface of the internal contact near the element, and made of a material whose thermal expansion coefficient is greater than or equal to the thermal expansion coefficient of the package and less than the thermal expansion coefficient of the resin encapsulation material.

2. The device of claim 1, wherein
the element is an optical element having an optical receiver portion, and
the device further comprises a transparent member formed to cover the optical receiver portion and adhered to the optical element.

3. The device of claim 1, wherein
the resin encapsulation material provides light blocking.

4. The device of claim 1, wherein
a part of the coating is located above the end surface of the internal contact near the element.

5. The device of claim 4, wherein
another part of the coating is located below the end surface of the internal contact near the element.

6. The device of claim 1, wherein
the coating is made of a same material as the package.

7. The device of claim 1, wherein
the package is formed by stacking a plurality of insulative substrates.

8. The device of claim 1, wherein
the package includes a plurality of insulative substrates and a resin material.

9. The device of claim 1, wherein
the package is formed by molding.

* * * * *